(12) United States Patent
Furusawa

(10) Patent No.: US 10,498,083 B2
(45) Date of Patent: Dec. 3, 2019

(54) IC SOCKET

(71) Applicant: Toshiba Memory Corporation, Minato-ku (JP)

(72) Inventor: Hisashige Furusawa, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/058,297

(22) Filed: Aug. 8, 2018

(65) Prior Publication Data

US 2019/0221971 A1    Jul. 18, 2019

(30) Foreign Application Priority Data

Jan. 12, 2018   (JP) .................................. 2018-003701

(51) Int. Cl.
| | |
|---|---|
| *H01R 13/641* | (2006.01) |
| *H01R 12/82* | (2011.01) |
| *H01R 13/70* | (2006.01) |
| *H01R 13/717* | (2006.01) |
| *H01R 13/66* | (2006.01) |

(52) U.S. Cl.
CPC ........... *H01R 13/641* (2013.01); *H01R 12/82* (2013.01); *H01R 13/6683* (2013.01); *H01R 13/70* (2013.01); *H01R 13/717* (2013.01)

(58) Field of Classification Search
CPC ...... H05K 7/10; H05K 7/1046; H05K 7/1007; G01R 1/0433
USPC .................................... 439/266, 331, 264, 73
See application file for complete search history.

(56) References Cited

U.S. PATENT DOCUMENTS

| | | | | | |
|---|---|---|---|---|---|
| 4,799,897 | A | * | 1/1989 | Mogi ................... | G01R 1/0433 439/264 |
| 4,846,703 | A | * | 7/1989 | Matsuoka ............ | H05K 7/1007 439/71 |
| 4,846,704 | A | * | 7/1989 | Ikeya ................. | G01R 31/2886 439/72 |
| 4,919,623 | A | * | 4/1990 | Billman ............... | G01R 1/0433 439/70 |
| 5,009,609 | A | * | 4/1991 | Matsuoka ............ | H05K 7/1007 439/264 |

(Continued)

FOREIGN PATENT DOCUMENTS

| | | |
|---|---|---|
| JP | 62-182677 | 8/1987 |
| JP | 3-70384 U | 7/1991 |
| JP | 2002-116238 | 4/2002 |

*Primary Examiner* — Tulsidas C Patel
*Assistant Examiner* — Marcus E Harcum
(74) *Attorney, Agent, or Firm* — Oblon, McClelland, Maier & Neustadt, L.L.P.

(57) ABSTRACT

According to one embodiment, there are contact pins, each of which is provided in a contact pin arrangement recess by corresponding to an arrangement position of a lead line of an IC, and changes a position in a vertical direction, depending on presence or absence of contact with the lead line. There are detection pins, each of which is inserted in a through-hole formed in a protruding portion of a cover by corresponding to an arrangement position of each contact pin, and moves up and down, depending on a position of the contact pin. A relative position of an upper surface of each detection pin relative to an upper surface of the cover differs between a first occasion where the contact pin is not in contact with the lead line and a second occasion where the contact pin is in contact with the lead line.

19 Claims, 11 Drawing Sheets

(56) References Cited

U.S. PATENT DOCUMENTS

| | | | | |
|---|---|---|---|---|
| 5,308,256 A | * | 5/1994 | Tonooka | G01R 1/0433 439/266 |
| 5,397,245 A | * | 3/1995 | Roebuck | G01R 1/0483 439/264 |
| 5,975,915 A | * | 11/1999 | Yamazaki | G01R 1/0433 439/331 |
| 5,989,039 A | * | 11/1999 | Sik | H05K 7/1061 439/331 |
| 6,297,654 B1 | * | 10/2001 | Barabi | G01R 1/0433 324/756.02 |
| 2001/0034150 A1 | * | 10/2001 | Kanesashi | H05K 7/1007 439/266 |
| 2002/0177343 A1 | * | 11/2002 | Miura | H05K 7/1023 439/266 |
| 2010/0041254 A1 | * | 2/2010 | Hsu | H05K 7/1046 439/73 |
| 2013/0171855 A1 | * | 7/2013 | Hayakawa | H05K 7/10 439/331 |

\* cited by examiner

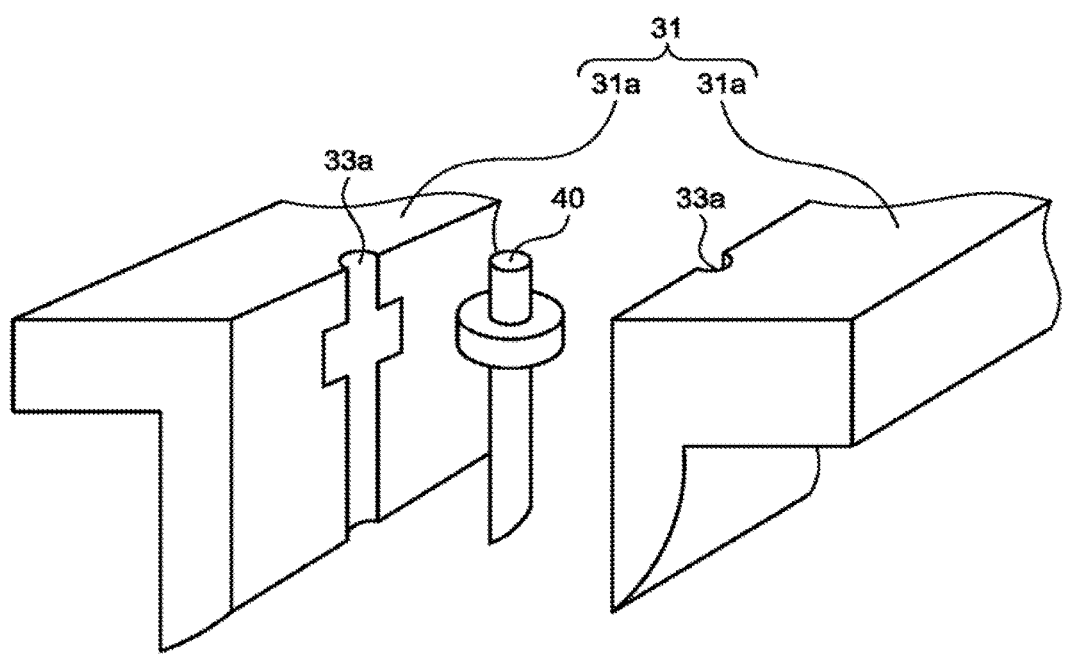

US 10,498,083 B2

IC SOCKET

CROSS-REFERENCE TO RELATED APPLICATIONS

This application is based upon and claims the benefit of priority from Japanese Patent Application No. 2018-003701, filed on Jan. 12, 2018; the entire contents of which are incorporated herein by reference.

FIELD

Embodiments described herein relate generally to an IC socket.

BACKGROUND

Conventionally, in the case of an Integrated Circuit (IC) package (which will be referred to as "IC", hereinafter) that includes leads protruding from side surfaces, a test is performed to the IC in a state attached to an IC socket. In order to confirm whether all the lead lines of the IC are set in contact with contact pins of the IC socket, electric measurement is used by causing a testing current to flow through the lead lines of the IC.

However, in the electric measurement according to the conventional technique, the IC ends up being subjected to an electric load.

BRIEF DESCRIPTION OF THE DRAWINGS

FIG. 3 is a sectional view schematically illustrating a configuration example of a cover according to the first embodiment;

DETAILED DESCRIPTION

In general, according to one embodiment, an IC socket includes a socket main body, contact pins, a cover, and detection pins. The socket main body includes an IC accommodation recess mounting an IC thereon, and a contact pin arrangement recess arranged outside the IC accommodation recess. Each of the contact pins is provided in the contact pin arrangement recess by corresponding to an arrangement position of a lead line of the IC, and changes a position in a vertical direction, depending on presence or absence of contact with the lead line. The cover includes a protruding portion in contact with the contact pins, and allowing the contact pins to be pushed. Each of the detection pins is inserted in a through-hole formed in the protruding portion of the cover by corresponding to an arrangement position of each contact pin, and moving up and down, depending on a position of the contact pin. A relative position of an upper surface of each detection pin relative to an upper surface of the cover differs between a first occasion where the contact pin is not in contact with the lead line and a second occasion where the contact pin is in contact with the lead line.

Exemplary embodiments of an IC socket will be explained below in detail with reference to the accompanying drawings. The present invention is not limited to the following embodiments.

First Embodiment

Figure 1:
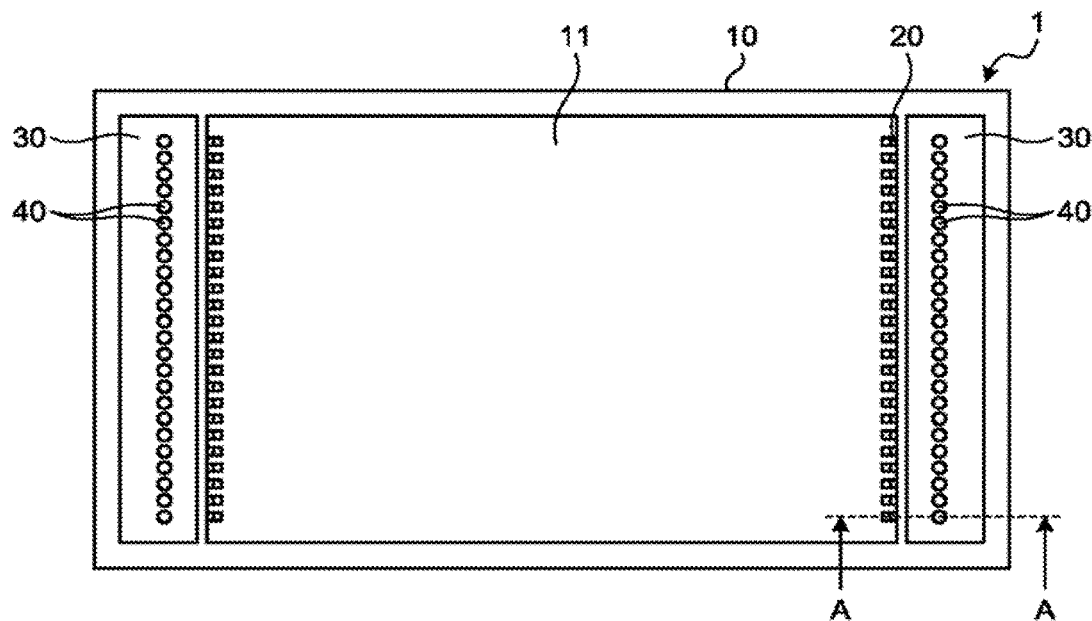
FIG. 1 is a top view illustrating an IC socket according to a first embodiment.
Figure 2:
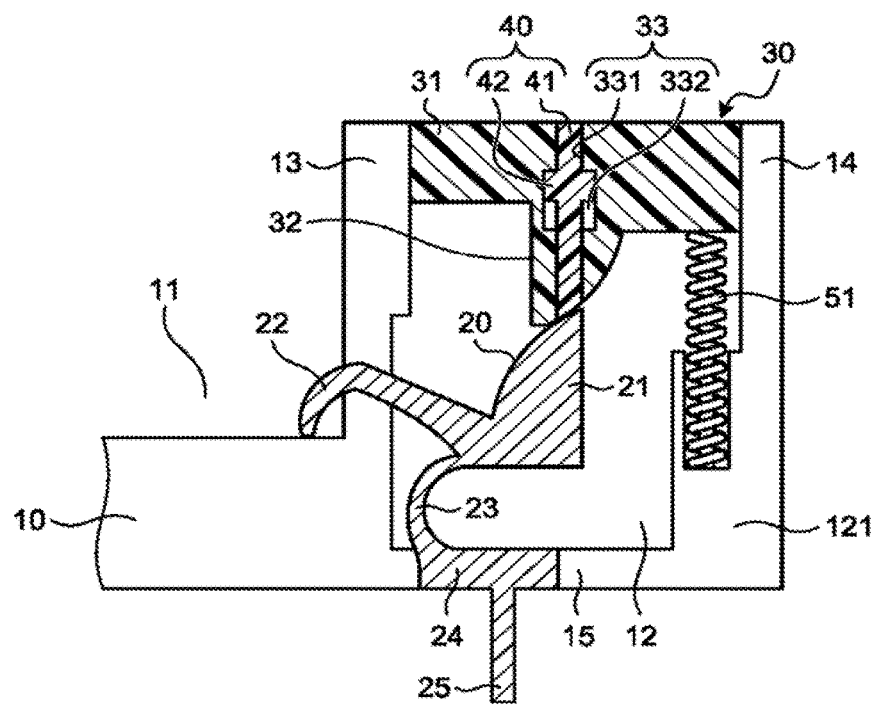
FIG. 2 is a sectional view taken along a line A-A of FIG. 1.

FIG. 1 is a top view illustrating an IC socket according to a first embodiment. FIG. 2 is a sectional view taken along a line A-A of FIG. 1. The IC socket 1 includes an insulating socket main body 10. A rectangular IC accommodation recess 11 for accommodating an IC is formed at the central portion of the socket main body 10. A contact pin arrangement recess 12, in which contact pins are arranged, is formed outside each of the two opposite sides of the IC accommodation recess 11. Each contact pin arrangement recess 12 is defined by a first sidewall 13 forming a side surface of the IC accommodation recess 11, a second sidewall 14 forming an outer peripheral side surface of the socket main body 10, and a bottom surface 15 of the socket main body 10. In the contact pin arrangement recess 12, contact pins 20 are arranged at predetermined intervals. Further, a cover 30 is arranged to cover the contact pin arrangement recess 12. The upper surfaces of the first side wall 13 and the second sidewall 14 are the same in position as each other.

As illustrated in FIG. 2, the contact pins 20 are fixed to the bottom surface 15 of the contact pin arrangement recess 12. Each contact pin 20 includes a push operation piece 21 to be pushed down when the cover 30 is pushed down; a touch portion 22 protruding from the push operation piece 21, to come into electrical contact with an IC lead; a spring portion 23 curved from near the push operation piece 21 side end of the touch portion 22 toward the bottom surface 15 of the contact pin arrangement recess 12; a base portion 24 connected to one end of the spring portion 23; and a contact portion 25 protruding from the base portion 24 to the side opposite to the push operation piece 21 and set in electrical contact with a testing circuit (not illustrated). The base portion 24 is fixed to the bottom surface 15 of the contact pin arrangement recess 12. That surface of the push operation piece 21, which is sec in contact with a protruding portion 32 of the cover 30, is formed as a surface having a certain curvature (which will be referred to as "R surface", hereinafter). Each contact pin 20 is made of a metal material or alloy material.

The cover 30 includes a plate-like cover main body 31 that covers the entirety of the contact pin arrangement recess 12, and the protruding portion 32 formed by corresponding to the arrangement positions of the contact pins 20. The cover main body 31 is formed slightly smaller than the contact pin arrangement recess 12 so that the cover main body 31 can move up and down in the contact pin arrangement recess 12. The protruding portion 32 is formed to protrude toward the bottom surface 15 side of the contact pin arrangement recess 12. in a state where no IC is accommodated in the IC accommodation recess 11, the protruding portion 32 is in contact with each contact pin 20 near the upper side of the push operation piece 21. Further, the surface of the protruding portion 32 set in contact with each contact pin 20 is also formed as an R surface. Thus, in this configuration, the protruding portion 32, which has an R surface, and the push operation piece 21 of each contact pin 20, which has an R surface, are set in contact with each other. As the cover 30 moves up and down, the push operation piece 21 of each contact pin 20 also moves up and down.

In the protruding portion 32, detection pins 40 axe provided, each of which can detect whether the touch portion 22 of the corresponding contact pin 20 has come into contact with an lead of an IC. Specifically, through-holes 33 are formed in the protruding portion 32 and the cover main body 31, and the respective detection pins 40 are inserted in these through-holes 33. Each detection pin 40 includes a rod portion 41 and a stopper 42. The rod portion 11 is a member in the form of a rod extending in one direction with an almost uniform diameter. The rod portion 41 has a length equal to the length from the upper surface of the cover main body 31 to the lower surface of the protruding portion 32 at the position where the corresponding through-hole 33 is formed. The stopper 42 is formed at an arbitrary region of the rod portion 41 other than the opposite ends to prevent the detection pin 40 from coining off the through-hole 33. The detection pin 40 changes the position in the height direction, depending on the position of the corresponding push operation piece 21.

Each through-hole 33 includes a hole part 331 that has a first diameter and penetrates the protruding portion 32 and the cover main body 31 in the thickness direction, and a cavity part 332 that has a second diameter and is formed in part of a region of the protruding portion 32 and the cover main body 31 other than the opposite ends in the thickness direction. The hole part 331 corresponds to the rod portion 41 of the detection pin 40, and the first diameter is formed slightly larger than the diameter of the rod portion 41. The cavity part 332 is formed by corresponding to the movement range of the stopper 42 of the detection pin 40, and the second diameter is formed larger than the first diameter and the diameter of the stopper 42. The cavity part 332 is provided to define the movement range of the detection pin 40 in the axial direction of the through-hole 33 (vertical direction).

The cover 30 is supported by the contact pins 20 and resilient members 51 in the contact pin arrangement recess 12. Each resilient member 51 is formed of a member that can expand and contract in the vertical direction, such as a spring. The resilient member 51 is fixed at one end, for example, to a support pedestal 121 provided on the second sidewall 14 aide of the contact pin arrangement recess 12, and supports the cover 30 at the other end. The cover 30 is supported by the resilient members 51 such that, when the cover 30 is at the position taken in a state where no IC is placed in the IC accommodation recess 11, i.e., in a state where the touch portion 22 of each contact pin 20 is in contact with the IC accommodation recess 11, the upper surface of the cover main body 31 is at the same height as the upper surfaces of the first sidewall 13 and the second sidewall 14. Further, in this state, the upper surface of each detection pin 10 is the same in position as the upper surface of the cover main body 31. In other words, the upper surface of the detection pin 40 and the upper surface of the cover main body 31 are flush with each other.

FIG. 3 is a sectional view schematically illustrating a configuration example of the cover according to the first embodiment. The cover main body 31 is divided into two cover components 31a by a plane extending through the axis of each through-hole 33 and in the longitudinal direction. Specifically, recesses 33a for forming each through-hole 33 are formed on the two cover components 31a at the positions corresponding to the arrangement position of each detection pin 40. When the cover 30 is to be assembled, each detection pin 40 is placed on the recess 33a of one of the cover components 31a, and then the other of the cover components 31a is joined to the one of the cover components 31a with the detection pin 40 sandwiched therebetween, so that these cover components 31a are fixed to each other.

Figure 4A:
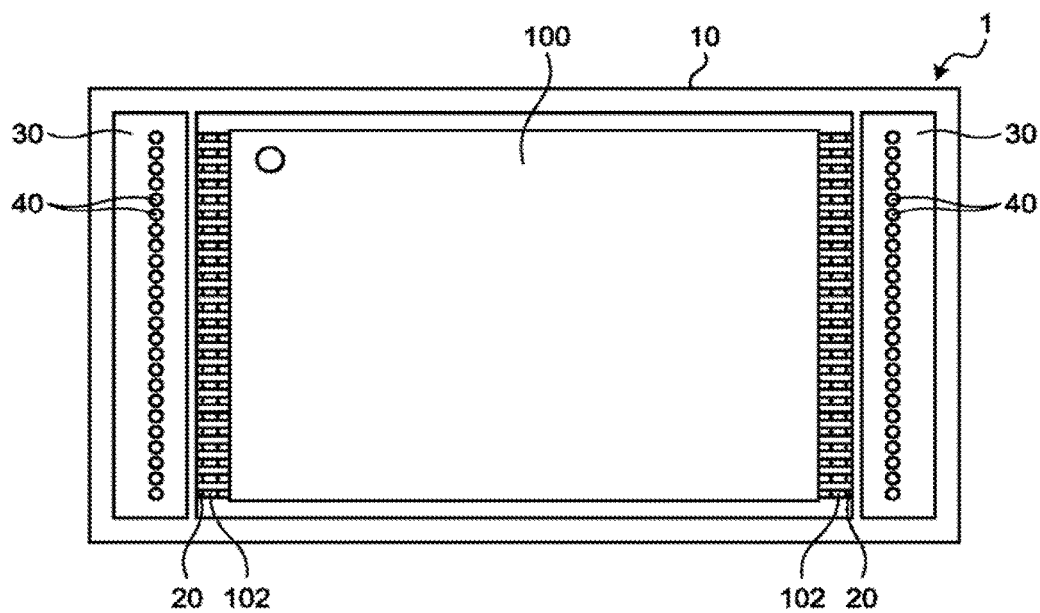
FIGS. 4A and 4B are top views schematically illustrating situation examples of attachment in the IC socket according to the first embodiment.
Figure 4B:
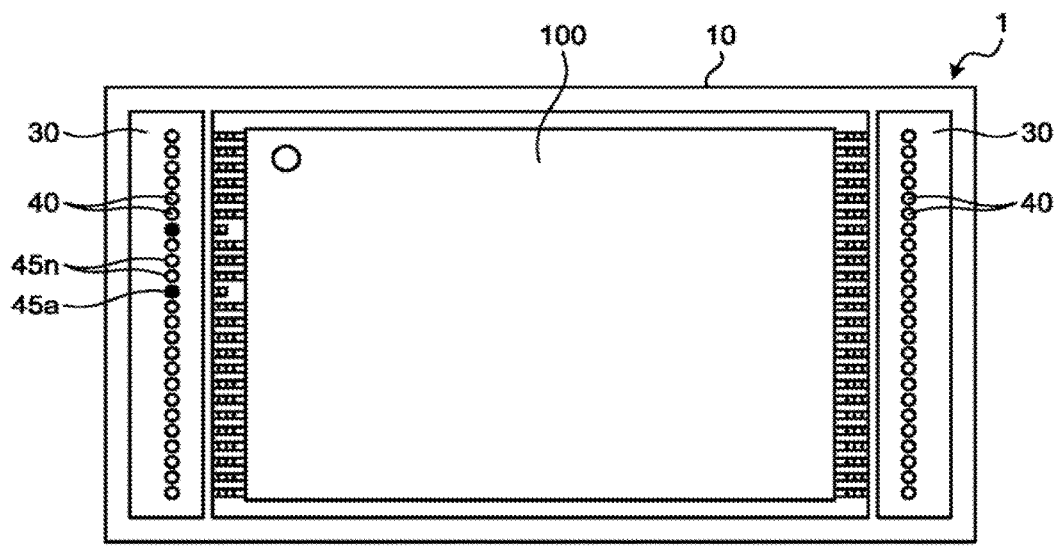
Figure 5A:
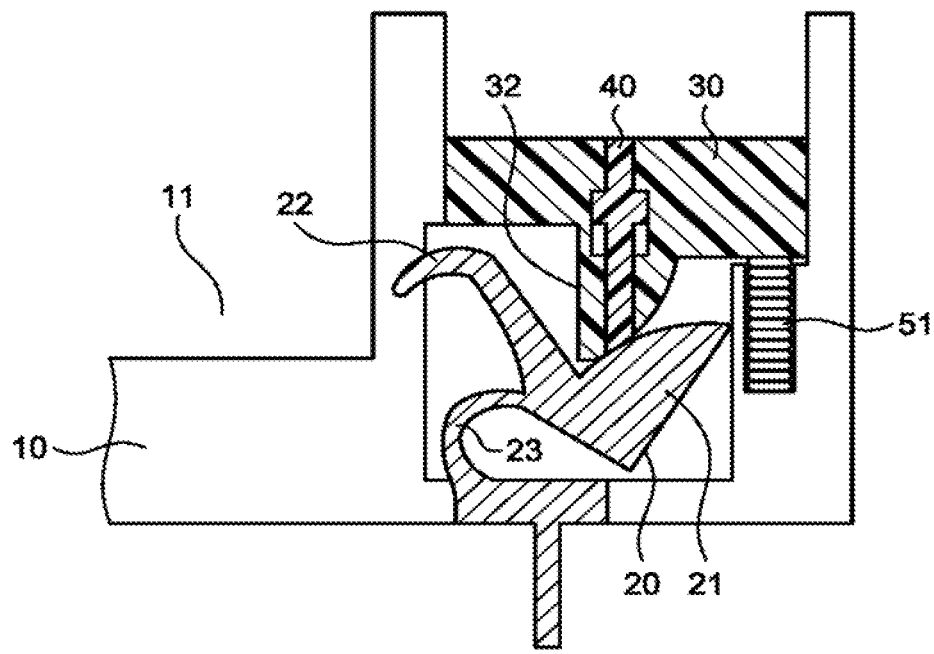
FIGS. 5A and 5B are sectional views schematically illustrating the situation examples of attachment near a contact pin of the IC socket according to the first embodiment.
Figure 5B:
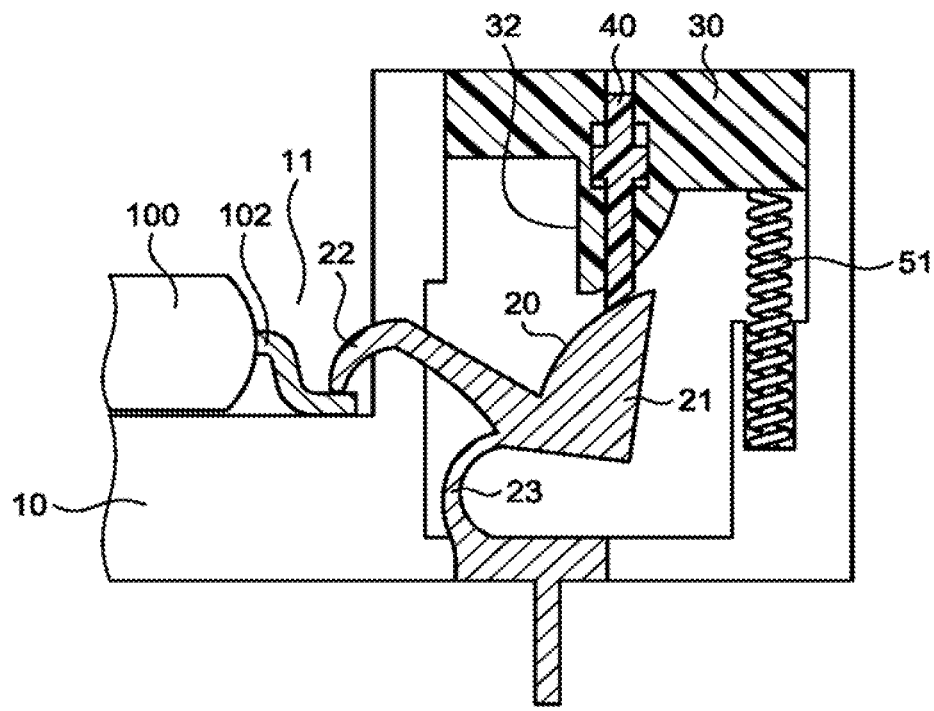
Figure 6A:
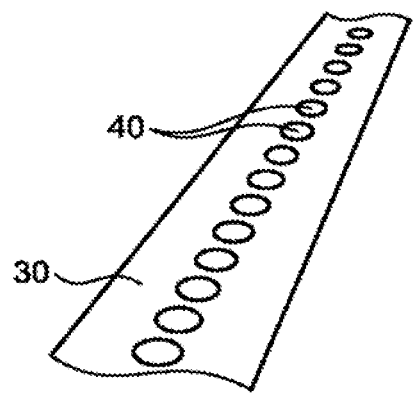
FIGS. 6A to 6C are perspective views illustrating situation examples of the cover when an IC is attached to the IC socket according to the first embodiment.
Figure 6B:
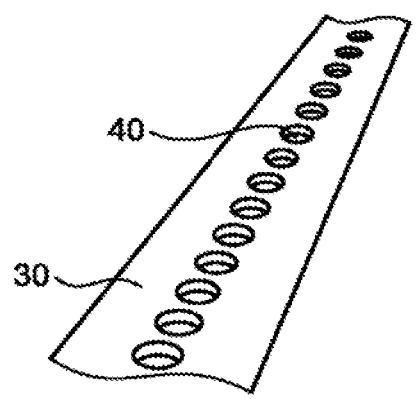
Figure 6C:
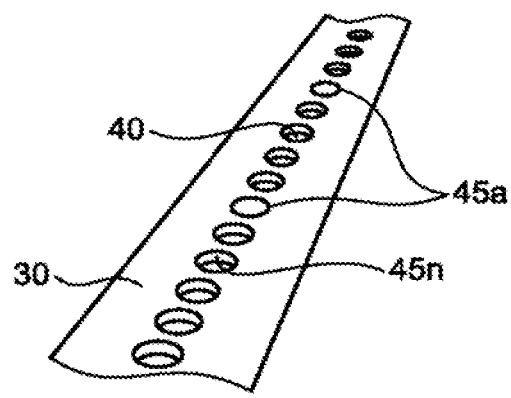

Next, an explanation will be given of attachment of an IC in this IC socket 1. FIGS. 4A and 4B are top views schematically illustrating situation examples of attachment in the IC socket according to the first embodiment. FIGS. 5A and 5B are sectional views schematically illustrating the situation examples of attachment near a contact pin of the IC socket according to the first embodiment. FIGS. 6A to 6C are perspective views illustrating situation examples of the cover when an IC is attached to the IC socket according to the first embodiment.

When no IC is attached to the IC socket 1, the IC socket 1 is in a state as illustrated in FIGS. 1, 2 and 6A. At this time, as illustrated in FIG. 2, the distal end of the touch portion 22 of each contact pin 20 is in a state in contact with the bottom surface of the IC accommodation recess 11. Further, as illustrated in FIGS. 1 and 6A, the upper surface of each detection pin 40 is at the same height as the upper surface of the cover 30.

When an IC 100 is to be attached to the IC socket 1, the cover 30 is pushed down. At this time, as illustrated in FIG. 5A, the protruding portion 32 at the lower surface of the cover 30 moves down while being in contact with the push operation piece 21 of each contact pin 20, and the contact pin 20 is thereby deformed. Specifically, as the spring portion 23 is deformed, the push operation piece 23 is inclined, and, as a result, the touch portion 22 is set into a state being held up. In this state, an IC 100 is placed in the IC accommodation recess 11. This state is illustrated in FIG. 4A.

Thereafter, the force of pushing down the cover 30 is cancelled. Consequently, the cover 30 is pushed up by the resilient members 51 to the original position. Further, as illustrated in FIG. 5B, each spring portion 23 is also urged to return the original state. However, as the distal end of each touch portion 22 is in contact with a lead line 102 of the IC 100, the position of the distal end of the touch portion 22 becomes higher than that in the case of FIG. 2 by an amount corresponding to the height of the lead line 102 of the IC 100. Since the position of the distal end of the touch portion 22 is higher, the spring portion 23 is deformed by that much, and the position of the push operation piece 21 is lowered correspondingly. As a result, a gap is formed between the upper end of the push operation piece 21 and the lower end of the protruding portion 32 of the cover 30.

Each detection pin 40 in the cover 30 is structured to be independent of the cover 30 and to change the position depending on the position of the corresponding push operation piece 21. Accordingly, as the position of the push operation piece 21 is lowered, the position of the detection pin 40 is also lowered. As illustrated in FIG. 6B, the position of the upper end of the detection pin 50 is thereby shifted downward from the upper surface of the cover 30. When each contact pin 20 is at the position taken when the touch portion 22 is in contact with a lead line 102 of the IC 100, a dimple is generated there. Here, the length of the touch portion 22 and the length of the push operation piece 21 have been adjusted such that the amount of falling of the push operation piece 21 is larger than the thickness of each lead line 102.

On the other hand, as illustrated in FIG. 2, when the touch portion 22 is not in contact with any lead line 102 of an IC 100, the upper end of the detection pin 40 is at the same height as the upper surface of the cover 30. Accordingly, when there is a touch portion 22 that is not in contact with any lead line 102 of the IC 100 placed in the IC accommodation recess 11, as illustrated in FIGS. 4B and 6C, the arrangement positions of the respective detection pins 40 of the cover 30 come to include mixedly a normal place 45n with a dimple formed therein, and an abnormal place 45a without a dimple formed therein. The normal place 45n is a place where the corresponding touch portion 22 is in contact with a lead line 102. On the other hand, the abnormal place 45a is a place where the corresponding touch portion 22 is not in contact with any lead line 102. In this way, as the upper surface of the cover 30 is observed, it becomes possible to easily specify the position of a contact pin 20 that is not in contact with any lead line 102.

Here, the side surface of each through-hole 33 may be colored so that the normal place 45n with a dimple formed therein can be clearly visually recognized. Alternatively, the side surface of each through-hole 33 may be provided with scale marks. In this case, even if lead lines 102 of an IC 100 to be measured have different thicknesses, the contact state of each contact pin 20 with a lead line 102 can be confirmed by a position indicated by the scale marks.

In the first embodiment, each detection pin 40 is inserted in the through-hole 33 formed at the position corresponding to the arrangement position of each contact pin 20 in the cover 30. The detection pin 40 is arranged to be in contact with the push operation piece 21, which causes the distal end of the touch portion 22 of the contact pin 20 to move up and down, so that the detection pin 40 can move up and down as the push operation piece 21 moves up and down. Further, the detection pin 40 is arranged such that, in a state where the touch portion 22 of the contact pin 20 is not in contact with any lead line 102 of an IC 100, the upper surface of the detection pin 40 is flush with the upper surface of the cover 30. According to this structure, the cover 30 is pushed down to raise the distal end of the touch portion 22 of each contact pin 20, and, in this state, an IC 100 is mounted onto the IC accommodation recess 11. Then, the cover 30 is returned to the original position, so that the touch portion 22 comes into contact with a lead line 102 of the IC 100. Consequently, the position of the push operation piece 21 is levered as compared with the case making no contact, and the upper surface of the detection pin 40 is shifted downward from the upper surface of the cover 30. On the other hand, at a contact pin 20 that is not in contact with any lead line 102, the upper surface of the detection pin 40 engaged with this contact pin 20 is flush with the upper surface of the cover 30. As a result, an effect is obtained such that it is possible to easily confirm by visual recognition the position of a contact pin 20 that is not in contact with any lead line 102 of the IC mounted on the IC socket 1.

Second Embodiment

In the first embodiment, the upper surface of each detection pin 40 is set to be at the same height as the upper surface of the cover 30 in the initial state where no IC 100 is placed in the IC accommodation recess 11. in the second embodiment, a case will be taken as an example where the upper surface of each detection pin 40 is set to be at the same height as the upper surface of the cover 30 in a state where an IC 100 is placed in the IC accommodation recess 11.

Figure 7A:
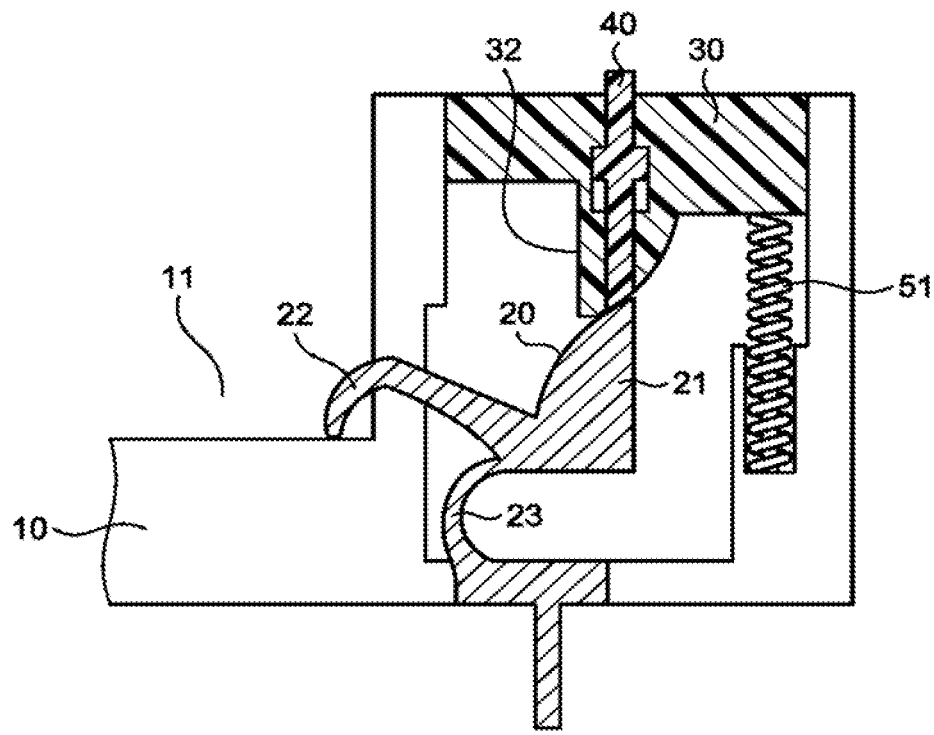
FIGS. 7A and 7B are sectional views schematically illustrating situation examples of attachment near a contact pin of an IC socket according to a second embodiment.
Figure 7B:
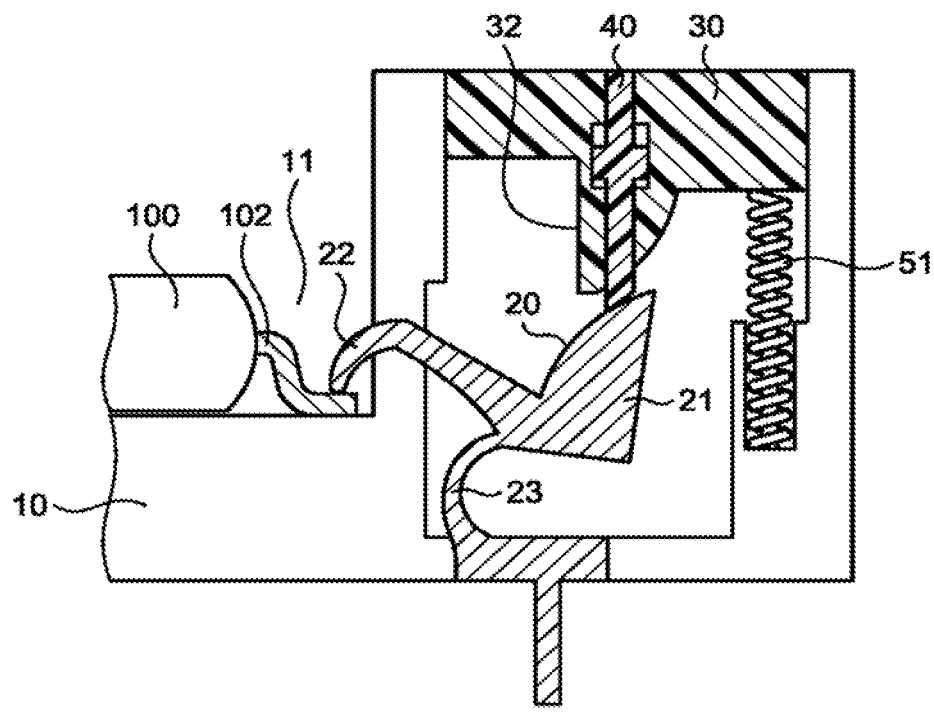

FIGS. 7A and 7B are sectional views schematically illustrating situation examples of attachment near a contact pin of an IC socket according to the second embodiment. FIGS. 5A to 5C are perspective views illustrating situation examples of a cover when an IC is attached to the IC socket according to the second embodiment.

Figure 8A:
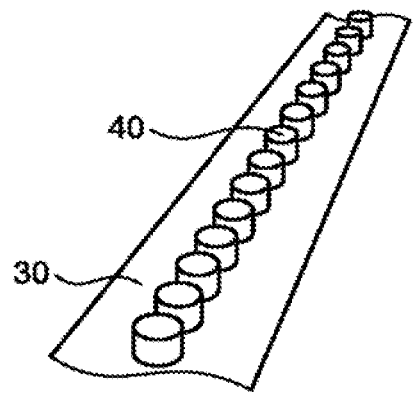
FIGS. 8A to 8C are perspective views illustrating situation examples of a cover when an IC is attached to the IC socket according to the second embodiment.

As illustrated in FIG. 7A, when no IC 100 is placed in the IC accommodation recess 11, the upper end of each detection pin 40 is in a state protruding from the upper surface of the cover 30. Accordingly, when the entirety of the cover 30 is viewed, as illustrated in FIG. 8A, the upper ends of the detection pins 40 are observed as being arrayed in a row in a protruding state.

Figure 8B:
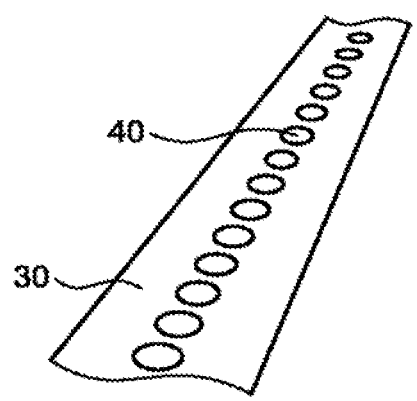

On the other hand, as illustrated in FIG. 7B, when an IC 100 is placed in the IC accommodation recess 11, and the touch portion 22 of each contact pins 20 is in contact with a lead line 102, the position of the push operation piece 21 is lowered, and the position of the corresponding detection pin 40 is also lowered. As a result, the upper end of each detection pin 40 is at the same high as the upper surface of the cover 30, i.e., the upper end is flush with the upper surface. In this case, when the entirety of the cover 30 is viewed, as illustrated in FIG. 8B, the upper surface of the cover 30 is observed as being flat.

Figure 8C:
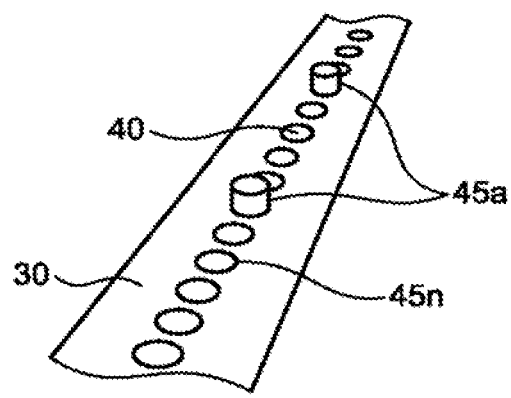

However, when there is a contact pin 20 whose touch portion 22 is not in contact with any lead line 102, as illustrated in FIG. 8C, the upper end of the detection pin 40, which corresponds to the contact pin 20 that is not in contact, with any lead line 102, is in a state protruding from the upper surface of the cover 30. In other words, a normal place 45n in a flat state and an abnormal place 45a in a protruding state are mixedly present. As a result, it becomes possible to confirm by visual recognition the presence and position of a contact pin 20 that is not in contact with any lead line 102. Here, the constituent elements corresponding to those described in the first embodiment are denoted by the same reference symbols, and their description is omitted.

Also in the second embodiment, an effect substantially the same as that of the first embodiment can be obtained.

Here, the side surface of each detection pin 40 may be colored so that the abnormal place 45a in a protruding state can be clearly visually recognized. Alternatively, the side surface of each detection pin 40 may be provided with scale marks. In this case, even if lead lines 102 of an IC 100 to be measured have different thicknesses, the contact state of each contact pin 20 with a lead line 102 can be confirmed by a position indicated by the scale marks.

Third Embodiment

In the first and second embodiments, the contact state of each contact pin 20 with a lead line 102 of an IC 100 is detected by using the relative position of the upper surface of the detection pin 40 relative to the upper surface of the cover 30. This detection may be performed by visually recognition of an operator, but, alternatively, this detection may be performed by using a sensor. According, in the third embodiment, an explanation will be given of a case where a sensor is used to detect the presence of a contact pin 20 that is not in contact with any lead line 102.

Figure 9:
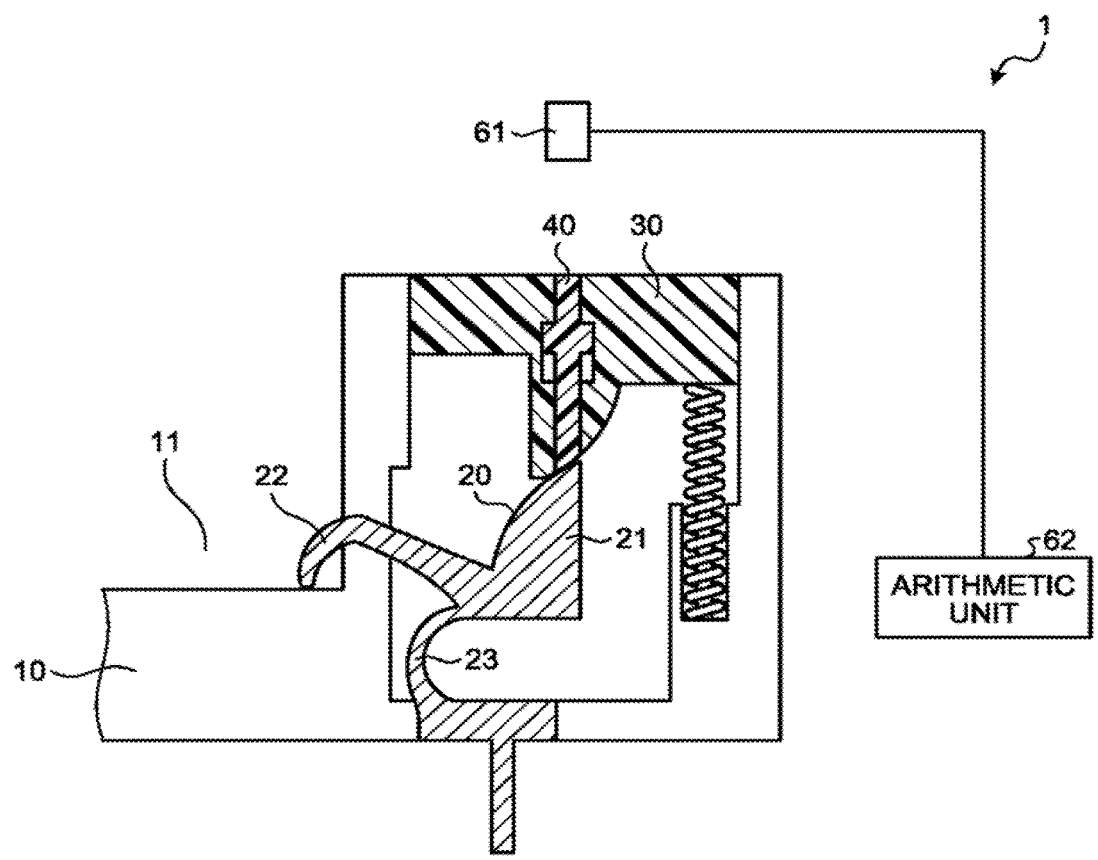
FIG. 9 is a partial sectional view schematically illustrating a configuration example of an IC socket according to a third embodiment.

FIG. 9 is a partial sectional view schematically illustrating a configuration example of an IC socket according to the third embodiment. The IC socket 1 includes a distance sensor 61 provided above each detection pin 40 of the IC socket 1 according to the first embodiment, and an arithmetic unit 62 that determines whether the corresponding contact pin 20 is in normal contact with a lead line 102, in accordance with a detection result obtained by the distance sensor 61.

The distance sensor 61 is a sensor used for measuring the distance from the position where the distance sensor 61 is arranged to the upper surface of the detection pin 40. For example, the distance sensor 61 used here may be a sensor of the type that measures the distance by measuring the time from when laser light is emitted by the distance sensor 61 until when the laser light is received by the distance sensor 61 after the laser light is reflected by the upper surface of the detection pin 40.

In a state where an IC 100 is attached to the IC socket 1, the arithmetic unit 62 compares a detection result sent from the distance sensor 61 provided for each detection pin 40 with a reference distance from the distance sensor 61 to the upper surface of the detection pin 40, and determines whether the detection result is equal to the reference distance. When the detection result is equal to the reference distance, this represents that the corresponding contact pin 20 is rested on a lead line 102, at the position of this detection pin 40, and thus this is determined to be normal. On the other hand, when the detection result is not equal to the reference distance, specifically when the detection result is smaller than the reference distance, this represents that the corresponding contact pin 20 is not rested on a lead line 102, at the position of this detection pin 40, and thus this is determined to be abnormal. In this case, the arithmetic unit 62 outputs information indicating that the corresponding contact pin 20 is not rested on a lead line 102 to a display unit or audio output unit (not illustrated), for example. As the arithmetic unit 62 can grasp the position of a detection pin 40 in the abnormal state, the arithmetic unit 62 may output the position of this detection pin 40 in the abnormal state. Further, when the defection result is to be compared with the reference distance, the reference distance may have a range.

Figure 10A:
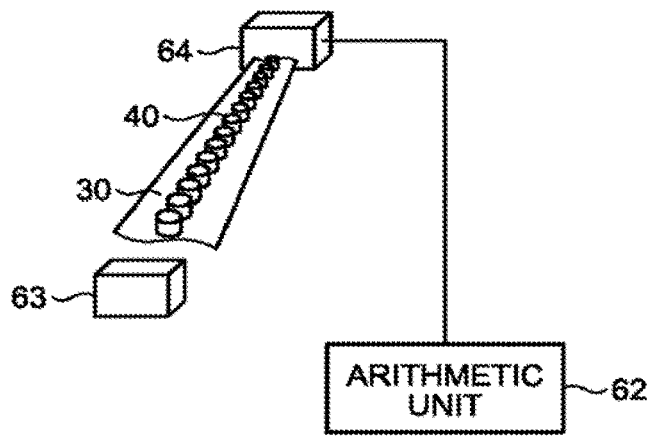
FIGS. 10A to 10C are diagrams schematically illustrating a configuration example of an IC socket according to the third embodiment.
Figure 10B:
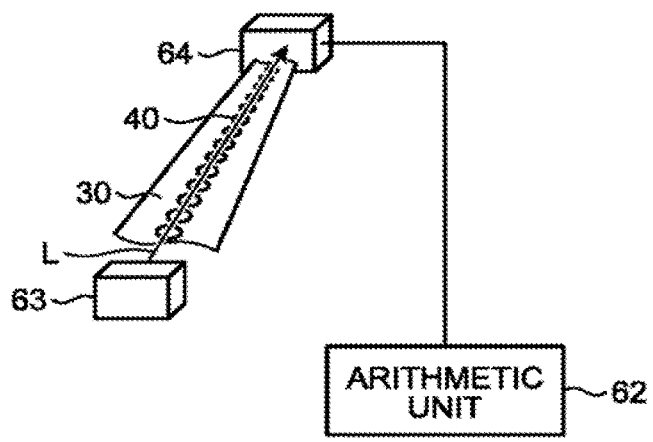
Figure 10C:
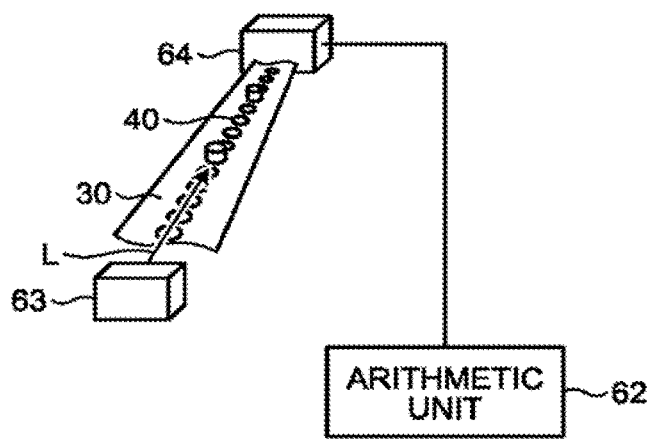

FIG. 9 illustrates a case where the sensor is set up with respect to the IC socket 1 according to the first embodiment. However, the distance sensor 61 may be provided above each detection pin 40 of the IC socket 1 according to the second embodiment. Further, in the case of the IC socket 1 according to the second embodiment, a sensor of a different type may be provided. FIGS. 10A to 10C are diagrams schematically illustrating a configuration example of an IC socket according to the third embodiment. The IC socket 1 includes a light emitting element 63 provided on one end side, and a light receiving element 64 provided on the other end side, with respect to the array of the detection pins 40 of the IC socket 1 according to the second embodiment. The IC socket 1 further includes an arithmetic unit 62 that gives notice of the presence of a contact pin 20 that is not in normal contact with a lead line 102.

As the light emitting element 63, for example, a Light Emitting Diode (LED) or the like may be used. As the light receiving element 64, for example, a photodiode or the like may be used. The light emitting element 63 and the light receiving element 64 are arranged on the extension of the array of the detection pins 40. Further, the light emitting element 63 and the light receiving element 64 are arranged at a height, to satisfy the following conditions. The light receiving element 64 cannot receive light from the light emitting element 63 in a state where a detection pin 40 protrudes from the cover 30; the light receiving element 64 can receive light from the light emitting element 63 in a state where the upper surface of each detection pin 40 is flush with the upper surface of the cover 30. In other words, in a state where an IC 100 is mounted on the IC accommodation recess 11, when the light receiving element 64 cannot receive light from the light emitting element 63, this represents that there is a contact pin 20 that is not in contact with any lead line 102; when the light receiving element 64 can receive light from the light emitting element 63, this represents that every contact pin 20 is in contact with a lead line 102.

For example, as illustrated in FIG. 10A, when no IC 100 is placed in the IC accommodation recess 11, the upper surface of each detection pin 40 protrudes from the upper surface of the cover 30. In this state, light emitted from the light emitting element 63 is blocked by the upper portion of each detection pin 40, and thus cannot reach the light receiving element 64. On the other hand, as illustrated in FIG. 10B, when an IC 100 is placed in the IC accommodation recess 11, and every contact pin 20 is in contact with a lead line 102, the upper surface of every detection pin 40 is flush with the upper surface of the cover 30. In this case, since no obstacle is present between the light, emitting element 63 and the light receiving element 64, light L emitted from the light emitting element 63 comes to be detected by the light receiving element 64. However, as illustrated in FIG. 10C, when some of the contact pins 20 are not in contact with any lead line 102, the upper end of each of the corresponding detection pins 40 comes into a state protruding from the upper surface of the cover 30, and thus light L emitted from the light emitting element 63 cannot reach the light receiving element 64.

In a state where an IC 100 is attached to the IC socket 1, the arithmetic unit 62 determines the presence or absence of a contact pin 20 that is not in contact with any lead line 102, in accordance with a detection result obtained by the light receiving element 64 about light from the light emitting element 63. When the light receiving element 64 detects light from the light emitting element 63, the arithmetic unit 62 determines that every contact pin 20 is in contact with a lead line 102. On the other hand, when the light receiving element 64 does not detect light from the light emitting element 63, the arithmetic unit 62 determines that there is a contact pin 20 that is not in contact with any lead line 102, and outputs information indicating that a contact pin 20 is not rested on a lead line 102.

Figure 11A:
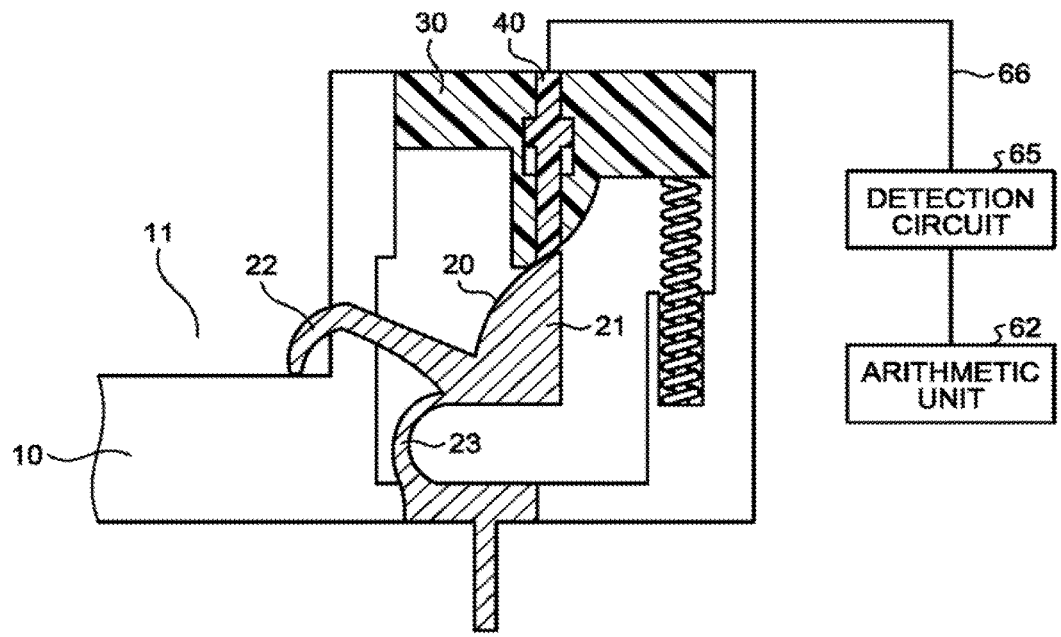
FIGS. 11A and 11B are partial sectional views schematically illustrating another configuration example of an IC socket according to the third embodiment.
Figure 11B:
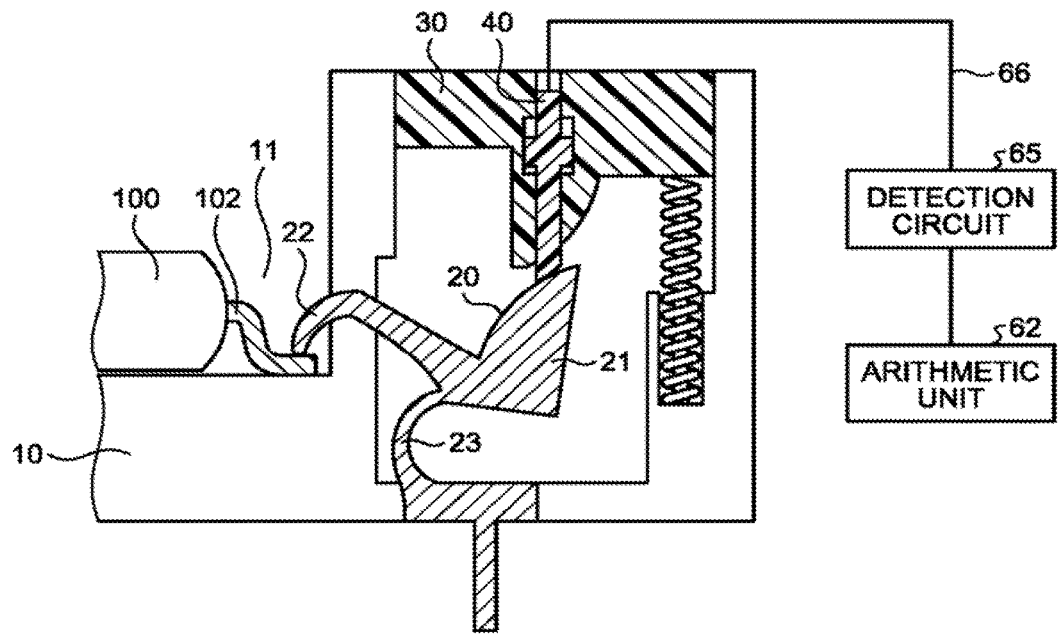

FIGS. 9 and 10A to 10C illustrate a case where optical detection is used to detect a contact pin 20 that is not in contact with any lead line 102; however, electric detection may be used instead. FIGS. 11A and 11B are partial sectional views schematically illustrating another configuration example of an IC socket according to the third embodiment. Each detection pin 40 of the IC socket 1 is provided with a detection circuit 65 for detecting the presence or absence of contact of the contact pin 20 with a lead line 102. The detection circuit 65 includes a switch, for example. The switch is configured to be turned off when the upper surface of the detection pin 40 moves down as illustrated in FIG. 11B, and to be turned on when the upper surface of the detection pin 40 moves up as illustrated in FIG. 11A. Here, a connection member 66 is provided that is fixed at one end to the upper surface of the detection pin 40 and is fixed at the other end to the switch. As the position of the upper end of the detection pin 40 is displaced, the connecting portion of the connection member 66 to the switch moves up and down, and the ON/OFF of the switch is thereby switched. Results of the OM/OFF in each detection circuit 65 are output to the arithmetic unit 62.

Consequently, when no IC 100 is attached to the IC socket 1, the switch of the detection circuit 65 provided for every detection pin 40 is in the ON-state. On the other hand, when an IC 10C is attached to the IC socket 1, and every contact pin 20 is in contact with a lead line 102, the switch of every detection circuit 65 is in the OFF-state. However, when an IC 100 is attached to the IC socket 1, and some of the contact pins 20 are not in contact with any lead line 102, the switch of the detection circuit 65 corresponding to each of the contact pins 20 that are not in contact with any lead line 102 is kept in the ON-state.

In a state where an IC 100 is attached, each detection circuit 65 outputs results of the ON/OFF of the switch to the arithmetic unit 62. When there is a switch kept in the ON-state, the arithmetic unit 62 outputs information indicating that the corresponding contact pin 20 is not rested on a lead line 102. Here, as the switch is in the ON-state at the position of a detection pin 40 in the abnormal state, the arithmetic unit 62 may output the position of this detection pin 40 in the abnormal state.

FIGS. 11A and 11B illustrate a case where the electric detection circuit 65 is set up with respect to the IC socket 1 according to the first embodiment. However, the electric detection circuit 65 illustrated in FIGS. 11A and 11B may be set up with respect to the IC socket 1 according to the second embodiment.

Here, in the case of FIGS. 11A and 11B, each detection circuit 65 is configured to output detection results to the arithmetic unit 62; however, each detection circuit 65 may be provided with a light emitting element, such as an LED, without using the arithmetic unit 62. In this case, when the switch is in the OFF-state, the light emitting element does not emit light, and, when the switch is in the ON-state, the light emitting element emits light. Consequently, as the presence or absence of light emitted from each light emitting element is confirmed by visual recognition, it is possible to confirm whether the corresponding contact pin 20 is rested on a lead line 102.

Further, in the case of FIGS. 11A and 11B, each detection circuit 65 is configured to be turned on when the corresponding contact pin 20 is in contact with a lead line 102; however, the detection circuit 65 may be configured to be turned off when the corresponding contact pin 20 is in contact with a lead line 102.

In the third embodiment, the sensor or detection circuit 65 is provided to detect whether each contact pin 20 is in contact with a lead line 102, and information is output that indicates that the contact pin 20 is not rested on a lead line 102. Consequently, it is possible to judge the contact status of an IC 100 in an instant, immediately after the IC is set in place. Further, it is possible to prevent an operator from overlooking that a contact pin 20 its not rested on a lead line 102. Further, as the sensor or detection circuit 65 is used to confirm the contact status of an IC 100, it is possible to arrange a plurality of IC sockets 1, to correspond to mass production.

Further, in the above description, the IC socket 1 is exemplified by the type that performs a test to an IC 100 having a shape with lead lines 102 protruding from two side surfaces of the package; however, this is not limiting. For example, in order to perform a test to an IC having a shape with lead lines 102 protruding from four side surfaces of the package, an IC socket 1 can be used that is suitable for the arrangement state of the lead lines 102 of the IC 100.

Figure 12:
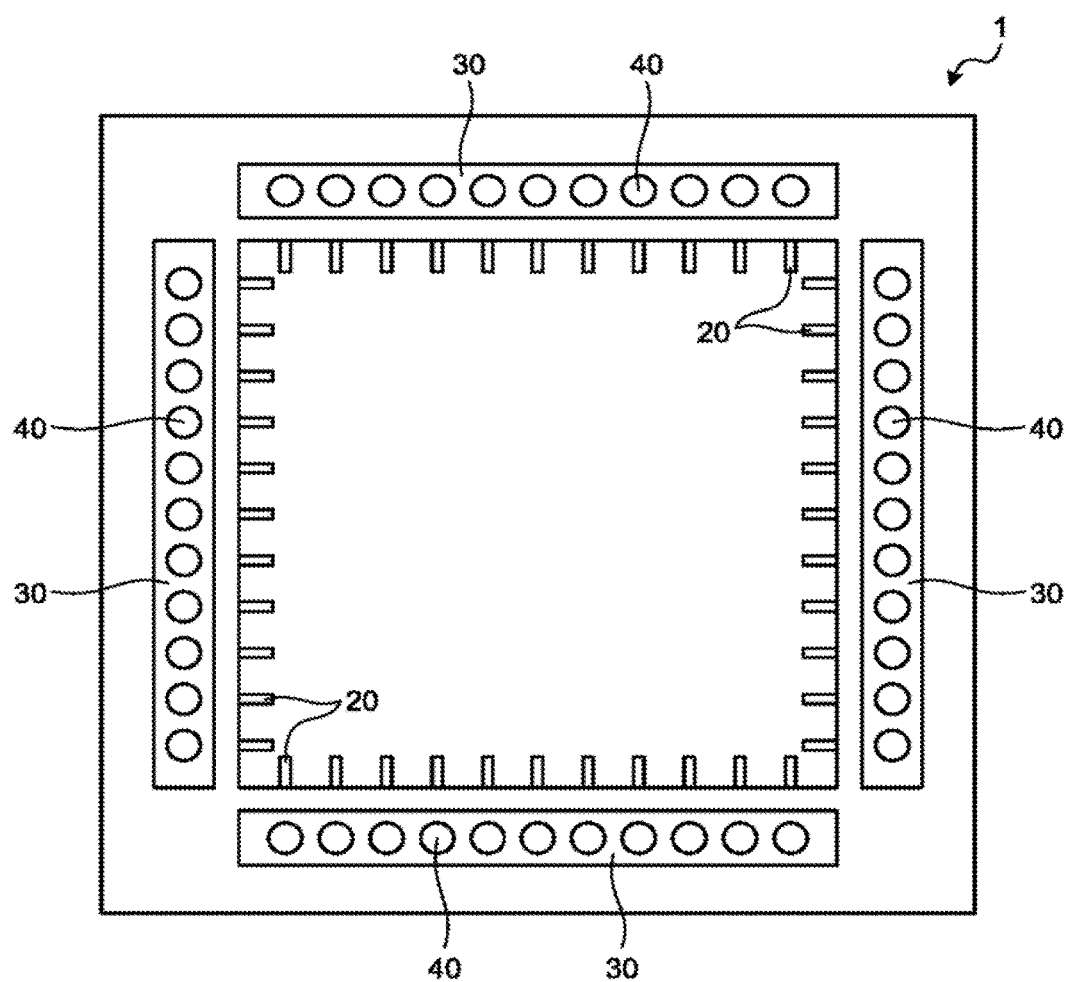
FIG. 12 is a top view schematically illustrating another example of an IC socket according to an embodiment.

FIG. 12 is a top view schematically illustrating another example of an IC socket according to an embodiment. As illustrated in FIG. 12, a contact pin arrangement recess 12 is formed outside each of the four sides of a rectangular IC accommodation recess 11. Here, the constituent elements corresponding to those described with reference to FIG. 1 are denoted by the same reference symbols, and their description is omitted. When the IC socket 1 described here is used, it is possible to address a test performed to an IC 100 having a shape with lead lines 102 protruding from four side surfaces of the package.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An IC socket comprising:
    a socket main body including an IC accommodation recess mounting an IC thereon, and a contact pin arrangement recess arranged outside the IC accommodation recess;
    contact pins, each of which is provided in the contact pin arrangement recess by corresponding to an arrangement position of a lead line of the IC, and changes a position in a vertical direction, depending on presence or absence of contact with the lead line;
    a cover including a protruding portion in contact with the contact pins, and allowing the contact pins to be pushed; and
    detection pins, each of which is inserted in a through-hole formed in the protruding portion of the cover by corresponding to an arrangement position of each contact pin, and moving up and down, depending on a position of the contact pin,
    wherein a relative position of an upper surface of each detection pin relative to an upper surface of the cover differs between a first occasion where the contact pin is not in contact with the lead line and a second occasion where the contact pin is in contact with the lead line.

2. The IC socket according to claim 1, wherein each detection pin has a length set such that, in the first occasion, the upper surface of the detection pin is flush with the upper surface of the cover, and, in the second occasion, the upper surface of the detection pin is positioned lower than the upper surface of the cover.

3. The IC socket according to claim 1, wherein each detection pin has a length set such that, in the first occasion, the upper surface of the detection pin protrudes from the upper surface of this cover, and, in the second occasion, the upper surface of the detection pin is flush with the upper surface of the cover.

4. The IC socket according to claim 1, wherein
    each contact pin includes a touch portion coming into contact with the lead line, and a push operation piece causing the touch portion to wove up and down with respect to a bottom surface of the IC accommodation recess as the push operation piece moves up and down, and
    the protruding portion of the cover is in contact with the push operation piece.

5. The IC socket according to claim 2, further comprising:
a sensor detecting presence of a detection pin whose upper surface is flush with the upper surface of the cover, in a state where the IC is mounted on the IC accommodation recess; and
an arithmetic unit outputting information indicating that a contact pin is not in contact with a portion on the lead line, when the sensor detects presence of a detection pin whose upper surface is flush with the upper surface of the cover.

6. The IC socket according to claim 5, wherein the sensor is a distance sensor provided for each detection pin.

7. The IC socket according to claim 3, further comprising:
a sensor detecting presence of a detection pin whose upper surface is positioned above the upper surface of the cover, in a state where the IC is mounted on the IC accommodation recess; and
an arithmetic unit outputting information indicating that a contact pin is not in contact with a portion on the lead line, when the sensor detects presence of a detection pin whose upper surface is positioned above the upper surface of the cover.

8. The IC socket according to claim 7, wherein the sensor is a distance sensor provided for each detection pin.

9. The IC socket according to claim 3, further comprising:
a light emitting element arranged at one end on extension of an array of the detection pins, to the light emitting element emitting light;
a light receiving element arranged at another end or extension of the array of the detection pins, the light receiving element detecting light from the light emitting element; and
an arithmetic unit outputting information indicating that a contact pin is not in contact with a portion on the lead line, when the light receiving element does not detect light from the light emitting element, in a state where the IC is mounted on the accommodations recess.

10. The IC socket according to claim 2, further comprising:
a detection circuit including a switch that is turned on when a detection pin is at a position corresponding to the first occasion, and that is turned off when the detection pin is at a position corresponding to the second occasion; and
an arithmetic unit outputting information indicating that a contact pin is not in contact with a portion on the lead line, when detecting that the detection circuit is turned on, in a state where the IC is mounted on the IC accommodation recess.

11. The IC socket according to claim 2, further comprising:
a detection circuit including a switch that is turned off when a detection pin is at a position corresponding to the first occasion, and that is turned on when the detection pin is at a position corresponding to the second occasion; and
an arithmetic unit outputting information indicating that a contact pin is not in contact with a portion on the lead line, when detecting that the detection circuit is turned off, in a state where the IC is mounted on the IC accommodation process.

12. The IC socket according to claim 10, wherein the detection circuit is provided for each detection pin.

13. The IC socket according to claim 3, further comprising:
a detection circuit including a switch that is turned on when a detection pin is at a position corresponding to the first occasion, and that is turned off when the detection pin is at a position corresponding to the second occasion; and
an arithmetic unit outputting information indicating that a contact pin is not in contact with a portion on the lead line, when detecting that the detection circuit is turned on, in a state where the IC is mounted on the IC accommodation recess.

14. The IC socket according to claim 3, further comprising:
a detection circuit including a switch that is turned off when a detection pin is at a position corresponding to the first occasion, and that is turned on when the detection pin is at a position corresponding to the second occasion; and
an arithmetic unit outputting information indicating that a contact pin is not in contact with a portion or the lead line, when detecting that the detection circuit is turned off, in a state where the IC is mounted on the IC accommodation recess.

15. The IC socket according to claim 13, wherein the detection circuit is provided for each detection pin.

16. The IC socket according to claim 2, wherein the through-hole has a side surface that is colored.

17. The IC socket according to claim 3, wherein each detection pin has a side surface that is colored.

18. The IC socket according to claim 2, wherein the through-hole has a side surface provided with scale marks.

19. The IC socket according to claim 3, wherein each detection pin has a side surface provided with scale marks.

* * * * *